(12) United States Patent
Gao (10) Patent No.: US 11,960,335 B2
(45) Date of Patent: Apr. 16, 2024

(54) LEAK DETECTION AND PREVENTION SYSTEM

(71) Applicant: Baidu USA LLC, Sunnyvale, CA (US)

(72) Inventor: Tianyi Gao, Sunnyvale, CA (US)

(73) Assignee: BAIDU USA LLC, Sunnyvale, CA (US)

(*) Notice: Subject to any disclaimer, the term of this patent is extended or adjusted under 35 U.S.C. 154(b) by 481 days.

(21) Appl. No.: 17/213,581

(22) Filed: Mar. 26, 2021

(65) Prior Publication Data

US 2022/0312645 A1    Sep. 29, 2022

(51) Int. Cl.
   *G06F 1/20*     (2006.01)
   *G01M 3/16*     (2006.01)
   *H05K 7/20*     (2006.01)

(52) U.S. Cl.
   CPC ............ *G06F 1/206* (2013.01); *G01M 3/165* (2013.01); *H05K 7/20781* (2013.01)

(58) Field of Classification Search
   CPC ......... G06F 1/206; G01M 3/165; G01M 3/16; H05K 7/20781; H05K 7/20254; H05K 7/20772; H05K 7/20272
   USPC ...................................................... 324/691
   See application file for complete search history.

(56) References Cited

U.S. PATENT DOCUMENTS

| | | | |
|---|---|---|---|
| 6,826,948 B1* | 12/2004 | Bhatti | G01M 3/188 |
| | | | 73/49.1 |
| 10,677,680 B1 | 6/2020 | Ortega Gutierrez et al. | |
| 10,704,983 B1* | 7/2020 | Tian | H01R 12/75 |
| 2007/0051166 A1 | 3/2007 | Baker et al. | |
| 2012/0191376 A1* | 7/2012 | Soles | F41A 23/56 |
| | | | 702/41 |
| 2013/0277008 A1 | 10/2013 | Ishikura et al. | |
| 2019/0107459 A1* | 4/2019 | Lin | G01M 3/16 |
| 2019/0364699 A1* | 11/2019 | Gao | H05K 7/20254 |
| 2020/0004156 A1* | 1/2020 | Hsieh | H01L 21/67288 |
| 2020/0025641 A1 | 1/2020 | Long et al. | |
| 2020/0340767 A1 | 10/2020 | Holden et al. | |

FOREIGN PATENT DOCUMENTS

JP    2013222914 A    10/2013
WO    2017023280 A1    2/2017

\* cited by examiner

*Primary Examiner* — Christopher P McAndrew
(74) *Attorney, Agent, or Firm* — WOMBLE BOND DICKINSON (US) LLP (57) ABSTRACT

A leak prevention system includes a liquid cooling device for a server. The liquid cooling device includes a fluid area configured to receive a cooling fluid. The leak prevention system also includes at least one pair of detection wires disposed within the liquid cooling device and at least partially surrounding the fluid area. The leak prevention system also includes a sensor connected to the detection wires and configured to detect when a cooling fluid contacts the detection wires.

20 Claims, 7 Drawing Sheets

LEAK DETECTION AND PREVENTION SYSTEM

FIELD OF THE DISCLOSURE

Embodiments of the present invention relate generally to server and electronic cooling systems. More particularly, embodiments of the invention relate to leak detection and prevention in server cooling systems.

BACKGROUND

Electronics cooling is an important market for computing hardware and other electronic devices, such as CPU servers, GPU servers, storage servers, networking equipment, edge and mobile systems, on-vehicle computing boxes and so on. Cooling of these electronics becomes more and more challenge to ensure they function properly by constantly providing designed thermal environments. Previous leak detection designs do not provide accurate leak detection in certain locations and for all leak scenarios. Furthermore, previous designs may only detect a leak once the leak has caused significant damage to a cooling system or servers.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

In the description of the embodiments provided herein, the terms "coupled" and "connected," along with their derivatives, may be used. It should be understood that these terms are not intended as synonyms for each other. "Coupled" is used to indicate that two or more elements, which may or may not be in direct physical or electrical contact with each other, co-operate or interact with each other. "Connected" is used to indicate the establishment of communication between two or more elements that are coupled with each other. Additionally, the terms "server," "client," and "device" are intended to refer generally to data processing systems rather than specifically to a particular form factor for the server, client, and/or device.

Embodiments described herein provide for a solution for developing leak detection and prevention solutions for servers, IT hardware equipment or other electronics packages products. In some embodiments, the present disclosure provides for a leak detection design that can precisely identify a leak location before damage to servers or IT hardware occurs. In data centers, there are many liquid-cooled servers connected in a cooling loop, and leaks may happen in any of the servers or locations within the cooling loop. Therefore, one problem solved by the present disclosure is to provide a design for the server liquid cooling leak detection system to provide actual leaking locations in any leaking incidents. In addition, the current leak detection design can be used on different liquid cooling components and devices, and the leak detection system accuracy in terms of the detailed leakage locations can be adjusted by different sensor implementations based on actual use cases and needs.

One of the key challenges for liquid cooling solutions for servers is reliability. Since liquid-cooled systems run fluid close to the electronics within the chassis, leaking of the liquid and fluid may cause serious damage to the system and electronics. Therefore, preventing critical leaks and early leak detection are critical challenges that should be overcome before a liquid-cooled solution can be deployed on a large scale.

Another challenge in leak detection and prevention systems is cost. Not only is the detection system hardware costly, but also the corresponding sensors and controls systems. If the leak detection system consumes a large portion of the cooling hardware cost budget, the solution may not be deployed successfully in an actual product. This is also one of the major challenges for deploying liquid-cooled systems at a large scale. In addition, high scalability and interoperability are critical features for leak detection solutions, since the solution may need to be used for different liquid cooling components used in server cooling modules. According to one embodiment, a leak detection and prevention system is disclosed which enables leak detection before the leaking fluid causes damage to electronics (i.e. before a critical leak occurs). The solution can be integrated with a server system easily, in some embodiments, and does not require expensive hardware costs. In some embodiments, the leak detection and prevention system can be co-fabricated with the cooling components or the cooling module, thus allowing it to be more easily deployed within a server system. This may enable the solution to be more easily accepted, and makes for more efficient deployment.

In an embodiment, the leak detection system includes several sections or components, including electrical detection wires, electrical circuits, and one or more sensors. The electrical detection wires may be integrated within the cooling units, such as the cold plates, cooling manifolds, fluid ports, etc. The electrical detection wires can be connected with the electrical wires which are directly connected to a DC power source, such as a DC voltage. The electrical detection wires may be partially connected to the electrical circuits, in some embodiments. The circuits can be an open circuit when there is no leakage, and the circuits can be closed by the fluid when any leak occurs. While the present disclosure describes in detail implementing the leak detection and prevention system in cooling plates, fluid manifolds, and fluid ports, the design concepts disclosed herein can be integrated into many different components or cooling modules in order to detect internal leakage before an actual critical leak occurs. This provides versatility to the invention, allowing it to be deployed in many different fluid components.

In the cooling components, the corresponding leak electrical detection wires can be assembled with the sealing structures or in their own dedicated channels, in various embodiments. The closed circuit is formed, and therefore the leak is detected, before the leaking fluid exits the cooling system or any components within the system that may causing damage to the electronics. Thus, a critical leak is prevented.

Electronics cooling is an important market, since it is a fundamental technology for new chips and electronics and it provides a basic thermal environment for proper design and operation. It is seen that thermal management is becoming more and more critical for high performance processors. As computing hardware and processors become more and more expensive, cooling reliability is critical to prevent any potential damage to expensive components.

System Overview

Figure 1A:
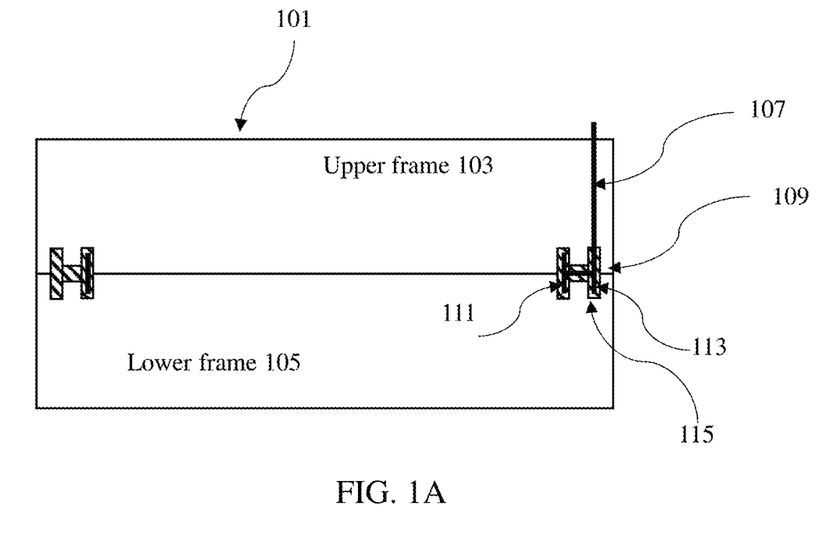
FIG. 1A shows a cross sectional side view of a leak detection and prevention system, according to an embodiment of the present disclosure.

FIG. 1A shows a cross sectional side view of a leak detection and prevention system, according to an embodiment of the present disclosure. In this embodiment, a side view of a cold plate 101 is presented, and the cold plate includes an upper frame 103 and a lower frame 105. Between the upper frame 103 and lower frame 105 is a sealing structure 109, which includes a sealing notch 115 configured to receive one or more sealing pads 113. It can be seen that the electrical wires 107 can extend from outside the cold plate, and be connected with electrical detection wires 111 located within the sealing structure 109 between the upper frame 103 and the lower frame 105. In some embodiments, a detailed wiring layout of the electrical wires 107 can be different depending on various factors, including the product design.

In the embodiment of FIG. 1A, there are two sealing notches and sealing structures within the cold plate, and the detection wires 111 can be located within the internal sealing structure or sealing pad. The sealing structure 109 and electrical detection wires 111 can provide fluid sealing and leak prevention and detection from any leaks that may happen between the upper frame 103 and the lower frame 105. The embodiment shown in FIG. 1A shows a solution developed on a commonly used cold plate. In some embodiments, co-design of the cooling components may be required in order to successfully implement the leak detection and prevention system.

Figure 1B:
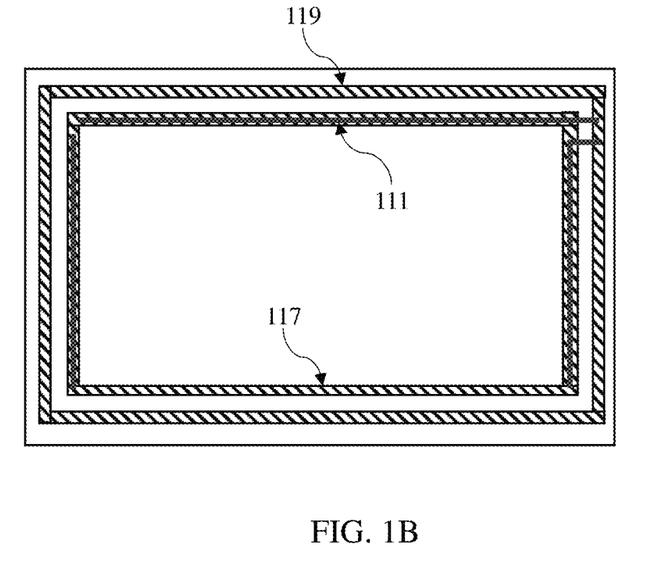
FIG. 1B shows a cross sectional top view of the leak detection and prevention system of FIG. 1A, according to an embodiment of the present disclosure.

FIG. 1B shows a cross sectional top view of the leak detection and prevention system of FIG. 1A, according to an embodiment of the present disclosure. It can be seen in this embodiment that there are two sealing pads/structures, including an inner sealing pad 117 and an outer sealing pad 119. The detection wires 111 are located within the inner sealing pad 117, and the detection wires at least partially surround an internal area of the cold plate along the upper, right, and left sides, in this embodiment. The detection wires 111 are each connected to the outer sealing pad 119, and then can extend to the exterior of the cold plate toward a sensor (shown in FIG. 3, etc.).

In this example embodiment, the detection wires 111 are assembled at the inner sealing pad 117 to ensure that once any leaked fluid flows into the inner sealing notch holding the inner sealing pad 117, the leaked fluid contacts the detection wires 111 and completes a closed circuit. In this embodiment, the outer sealing pad 119 provides additional fluid sealing. This means that the leak is detected before any fluid flows out of the cold plate. In a cold plate design, since the upper frame and lower frame are two separate parts attached together, therefore the contacting layer may leak if no proper sealing is added. It can be seen that the design shown in FIGS. 1A-1B can detect a leak before any critical leak actually occurs, thus significantly improving system reliability.

The detection circuit used can be any suitable type of cable, such as copper wire. Several features of the detection wires may include the following. There may be two portions of the electrical wires: one portion used for detection, and the other portion used as a common electrical wire for completing a closed circuit loop. The detection wires 111 can be integrated into the sealing structure, and they can be placed in several disconnected locations, which can be connected by fluid in leaking incidents. In some embodiments, integrating the detection wires 111 with the inner sealing pad 117 simplifies construction, as the same channel can be used to hold the inner sealing pad 117 and the detection wires 111.

Figure 2:
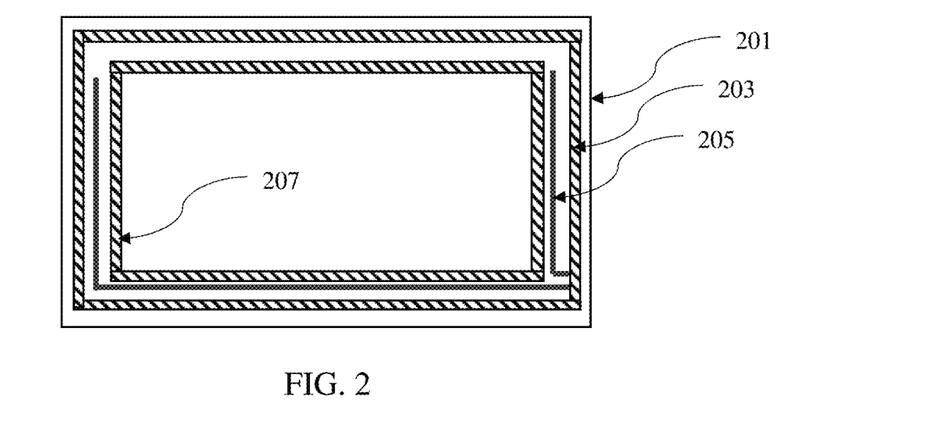
FIG. 2 shows a cross sectional top view of another leak detection and prevention system, according to an embodiment of the present disclosure.

FIG. 2 shows a cross sectional top view of another leak detection and prevention system, according to an embodiment of the present disclosure. In this embodiment, the detection wires 205 are located within their own channel in the cold plate 201 between the inner sealing pad 207 and the outer sealing pad 203. In this design, the inner sealing pad 207 provides a first level of sealing. If any potential leaking happens within the cold plate, the fluid may flow to through the ring formed by the inner sealing pad 207, and then to a detection channel holding the detection wires 205. Once the fluid flows into contact with the detection wires 205, the closed circuit will enable a sensor to trigger a leakage alarm. In such an embodiment, even though a leak occurs within the cold plate 201, the leak is detected before any fluid flows out of the cold plate 201, thus preventing a critical failure and preventing any damage to servers or IT equipment. In addition, the outer sealing pad 203 provides an additional layer of protection past the detection wires 205. Since the main material of the cold plate 201 may be copper, proper isolation may need to be designed for the detection wires 205, and such isolation may provide additional leak protection, in some embodiments. However, by proper voltage design on the detection circuit, isolation may not be necessary in every instance.

Figure 3:
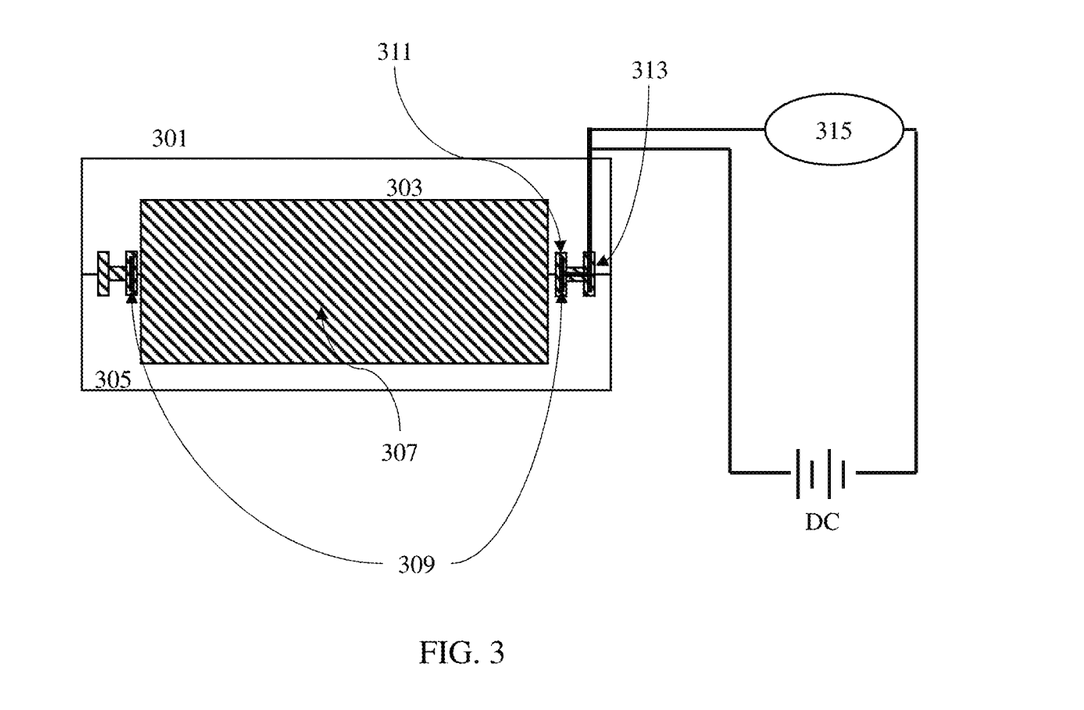
FIG. 3 shows another design of a leak detection and prevention system, according to an embodiment of the present disclosure.

FIG. 3 shows another design of a leak detection and prevention system, according to an embodiment of the present disclosure. In this embodiment, the leak detection and prevention system includes a cooling unit 301, such as a cold plate, that includes an upper frame 303 and a lower frame 305. The cooling unit 301 contains a fluid area 307, and both an inner sealing pad 311 and an outer sealing pad 313 surround the fluid area 307. The detection wires 309 in this embodiment are located within the same channel as the inner sealing pad 311, and are connected to a sensor 315, that is in turn connected to a power source, such as a DC source. The fluid area 307 is the designed working area for the cooling fluid of the cooling unit 301, and any fluid leaking out of this fluid area 307 will contact with the inner sealing pad 311 as well as the detection wires 309 in the same channel. The sensor 315 may be any type of sensor, such as a current sensor. The current sensor can be used as the leakage signal and used as an input to a controller, in some embodiments. In this embodiment, once fluid leaks beyond the fluid area 307 and contacts the detection wires 309, a closed circuit is formed for the sensor 315 with the DC source.

Figure 4:
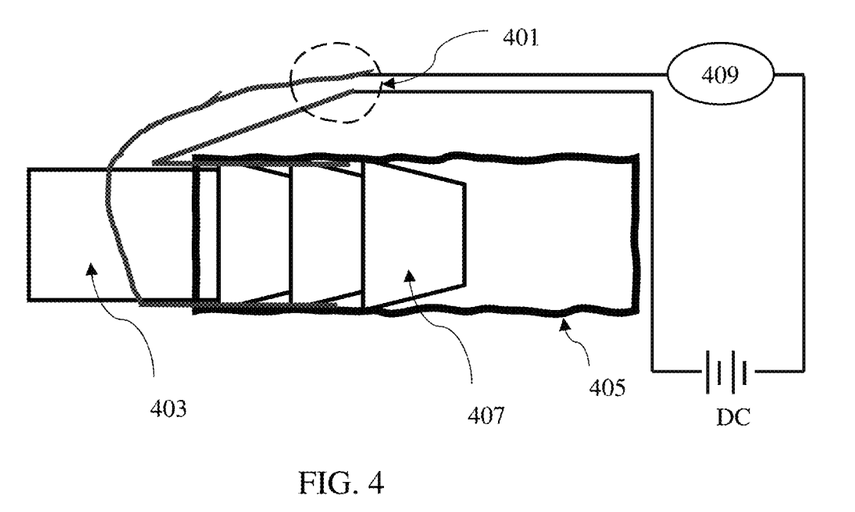
FIG. 4 shows a cross sectional side view of a leak detection system assembled on a barb and hose assembly, according to an embodiment of the present disclosure.

FIG. 4 shows a cross sectional side view of a leak detection system assembled on a barb and hose assembly, according to an embodiment of the present disclosure. In this embodiment, the liquid cooling system includes a fluid port 403, which includes a number of barbs 407. The barbs 407 can be angled annular features extending radially outward from the external surface of the fluid port 403. A fluid hose 405 can be fit around one side of the fluid port 403 in order to provide a cooling fluid to the cooling system (i.e. the cold plate), and the barbs 407 can interact with and create a seal with the fluid hose 405. The detection wires 401 can be connected to a sensor 409 and a DC voltage for detecting a leak. The detection wires can also be positioned at a junction between the fluid port 403 and the fluid hose 405, and can pass across at least one of the barbs 407. In this embodiment, the detection wires 401 are positioned between the external surface of the fluid port 403 and the fluid hose 403 and pass across two of the barbs 407, such that if fluid leaks past the first barb, the leak will be detected before it passes beyond the entire junction between the fluid port 403 and the fluid hose 405. In alternative embodiments, the detection wires 401 can pass across fewer or more barbs, as long as they pass across at least one, but not all, of the barbs. In this way, the detection wires 401 can detect a leak within the junction of the fluid port 403 and the fluid hose 405 before cooling fluid can leak beyond the junction. In some embodiments, the fluid port 403 can be a fluid port integrated with a fluid manifold or a cold plate, or any other component of a fluid-cooled system that may transmit or receive cooling fluid. The fluid port 403 can include any number of barbs 407 (frequently three, but some designs could include as few as two), and the barbs can have various different geometries, in some embodiments. In other embodiments, the fluid port can have no barbs, and the fluid hose can be secured to the fluid port using a clamp. An example of such a design is described in more detail in reference to FIG. 6.

Figure 5:
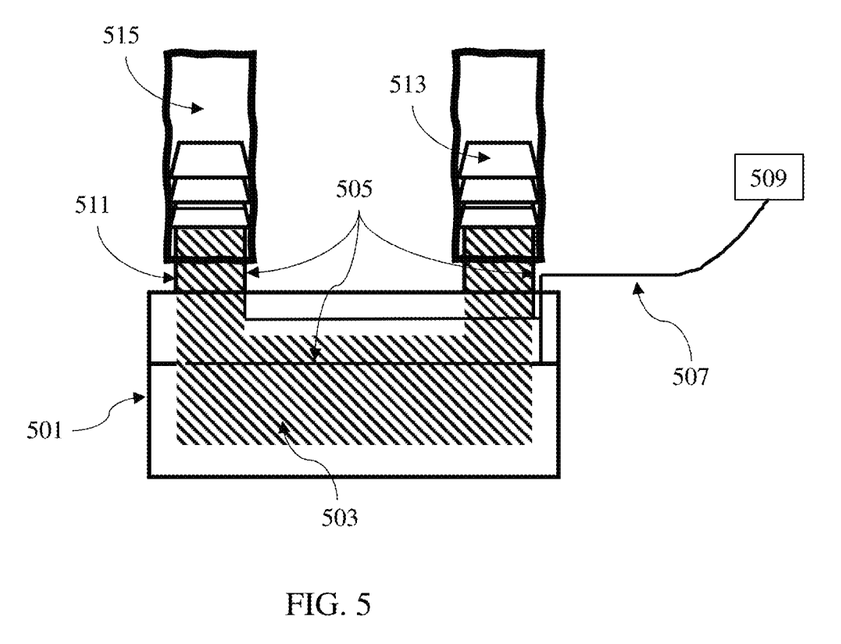
FIG. 5 shows another design of a leak detection and prevention system with barbed fluid ports, according to an embodiment of the present disclosure.

FIG. 5 shows another design of a leak detection and prevention system with barbed fluid ports, according to an embodiment of the present disclosure. FIG. 5 shows a cooling module including multiple cooling components, cold plate, hoses, and fluid barb. In this embodiment, a cold plate 501 includes a fluid area 503 filled with a cooling fluid, and this fluid area 503 is configured to connect with two fluid hoses 515 via fluid ports 511. These fluid ports 511 include a number of barbs 513 that can engage with the fluid hoses 515 to secure the hoses 515 on the fluid ports 511. In this embodiment, the detection wires 505 are located at the fluid area 503 (for example, as described in FIGS. 1A-3), and also at the barbed fluid ports 511 (for example, as described in FIG. 4). The detection wires 505 are then able to connect with a sensor 509 via an electrical connection 507. In one embodiment, the corresponding detection circuits for the fluid ports 511 and cold plate 501 may be assembled in a parallel manner to ensure that any leakage may form a complete circuit.

Figure 6:
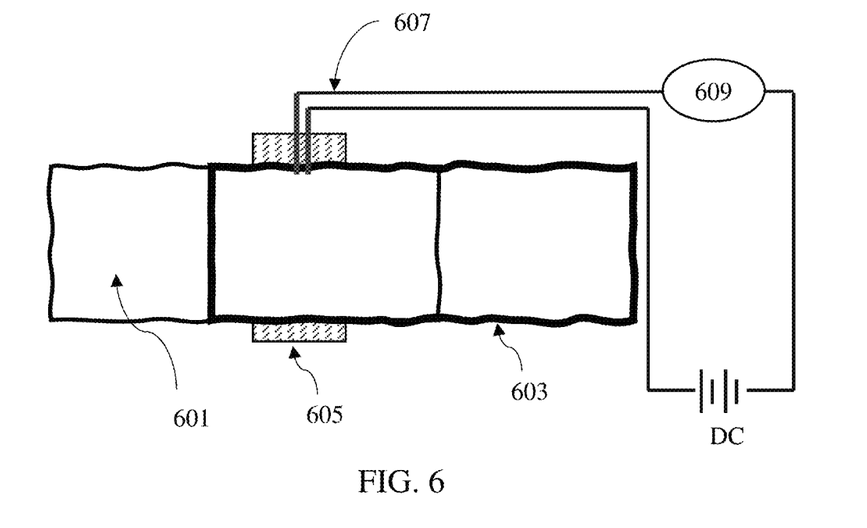
FIG. 6 shows a cross sectional side view of a leak detection system assembled on a clamp and hose assembly, according to embodiments of the present disclosure.

FIG. 6 shows a cross sectional side view of a leak detection system assembled on a clamp and hose assembly, according to embodiments of the present disclosure. In this embodiment, a fluid hose 603 can be secured around another fluid hose 601, or a fluid port of a fluid manifold or cold plate, by using a clamp 605 that can be tightened around the junction between the fluid hoses 601, 603. In an embodiment, the detection wires can be located between the fluid hoses 601, 603, or located at some other position at the junction between the fluid hoses 601, 603, and held in place by the clamp 605. In an embodiment, detection wires 607 can be integrated into the clamp 605 such that a leak at the junction between the fluid hoses 601, 603 will be detected by the sensor 609. In some embodiments, fluid connection described in FIG. 6 can be a fluid port integrated with a fluid manifold or a cold plate, or any other component of a fluid-cooled system that may transmit or receive cooling fluid.

Figure 7:
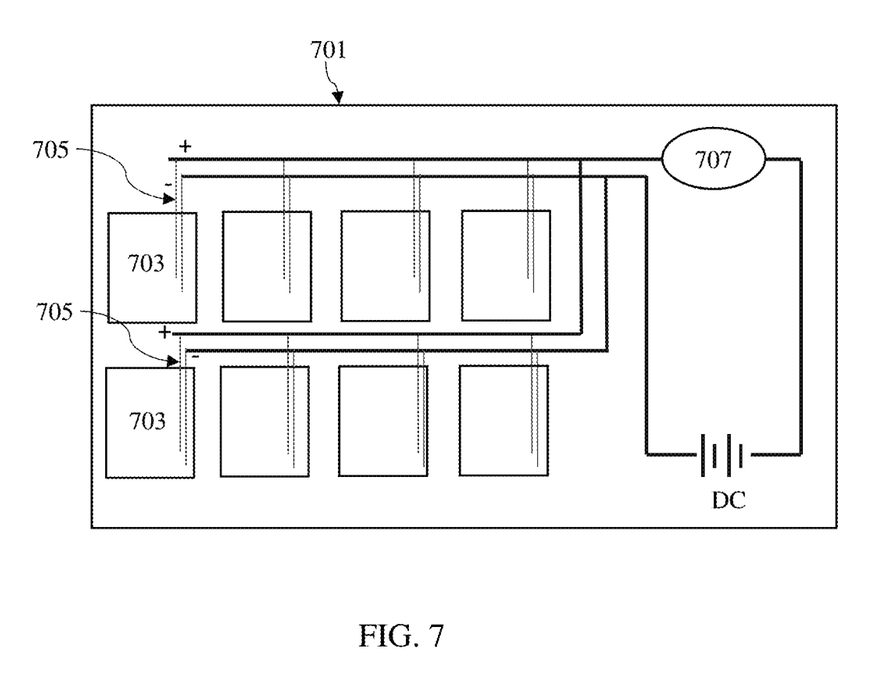
FIG. 7 shows a diagram of a server cooling module, according to embodiments of the present disclosure.

FIG. 7 shows a diagram of a server cooling module 701, according to embodiments of the present disclosure. In this embodiment, the server cooling module 701 has several cold plates 703, and each cold plate can include a set of detection wires 705. The detection circuit for each cold plate 703 can be separate, as shown in this embodiment, and can then be connected to one main circuit with a DC source and a sensor 707. In this design, only one sensor 707 is used. This means the detection accuracy is on the server level, and any of leak among all of the cold plates 703 may trigger the alarm. In another embodiment, the sensor 707 can identify the accurate leak locations through internal design.

Figure 8:
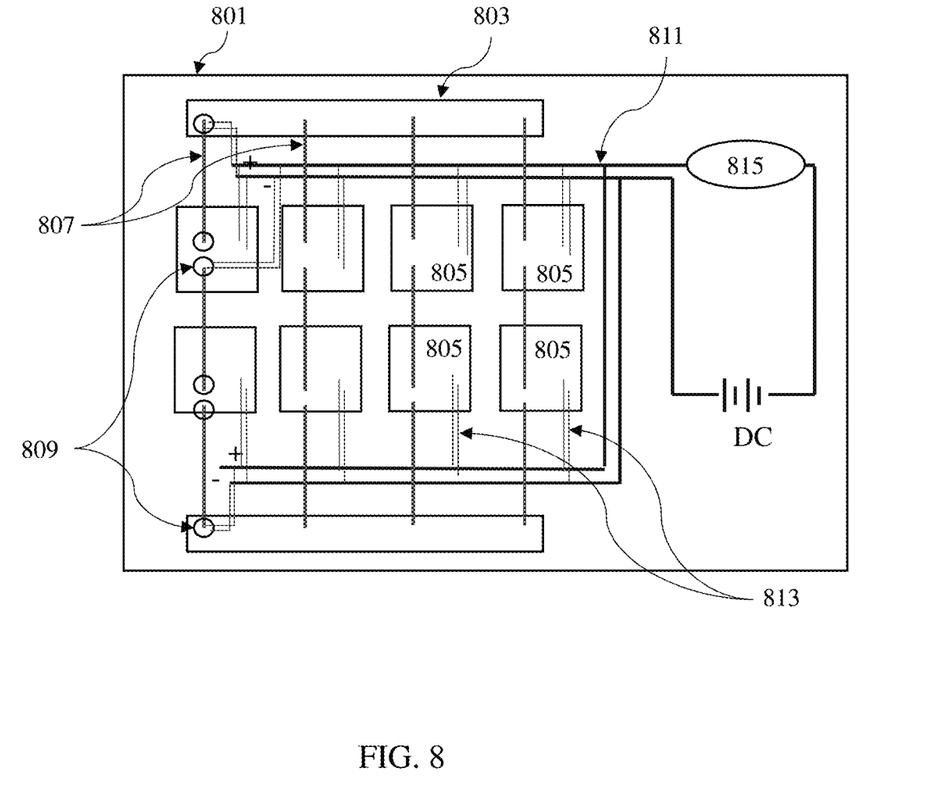
FIG. 8 shows a diagram of another server cooling module, according to embodiments of the present disclosure.

FIG. 8 shows a diagram of another server cooling module 801, according to embodiments of the present disclosure. In this embodiment, the server cooling module 801 includes a fluid distribution manifolds 803 as well as a number of cold plates 805. In this embodiment, each fluid manifold 803 can service a certain number of cold plates 805 via fluid lines 807. The detection wires 813 are shown as examples to represent an efficient system level leakage detection implementation, where detection wires 813 are located at each cold plate 805, and also at a number of fluid ports 809. The fluid ports 809 can be barbed fluid ports, as described in FIGS. 4-5, in some embodiments.

In an embodiment, the server cooling module 801 also includes an electrical detection bus 811 that can connect each of the individual detection circuits formed by the detection wires 813. Using the electrical bus 811, the leak detection and prevention solution can be implemented to different cooling components within the cooling module 801. In this embodiment, all of the detection circuits can be connected to the electrical bus 811, which can be designed as a standard port on the cooling module. In some embodiments, the electrical bus 811 can also function as a port to connect with a server DC source, or other DC source.

Figure 9:
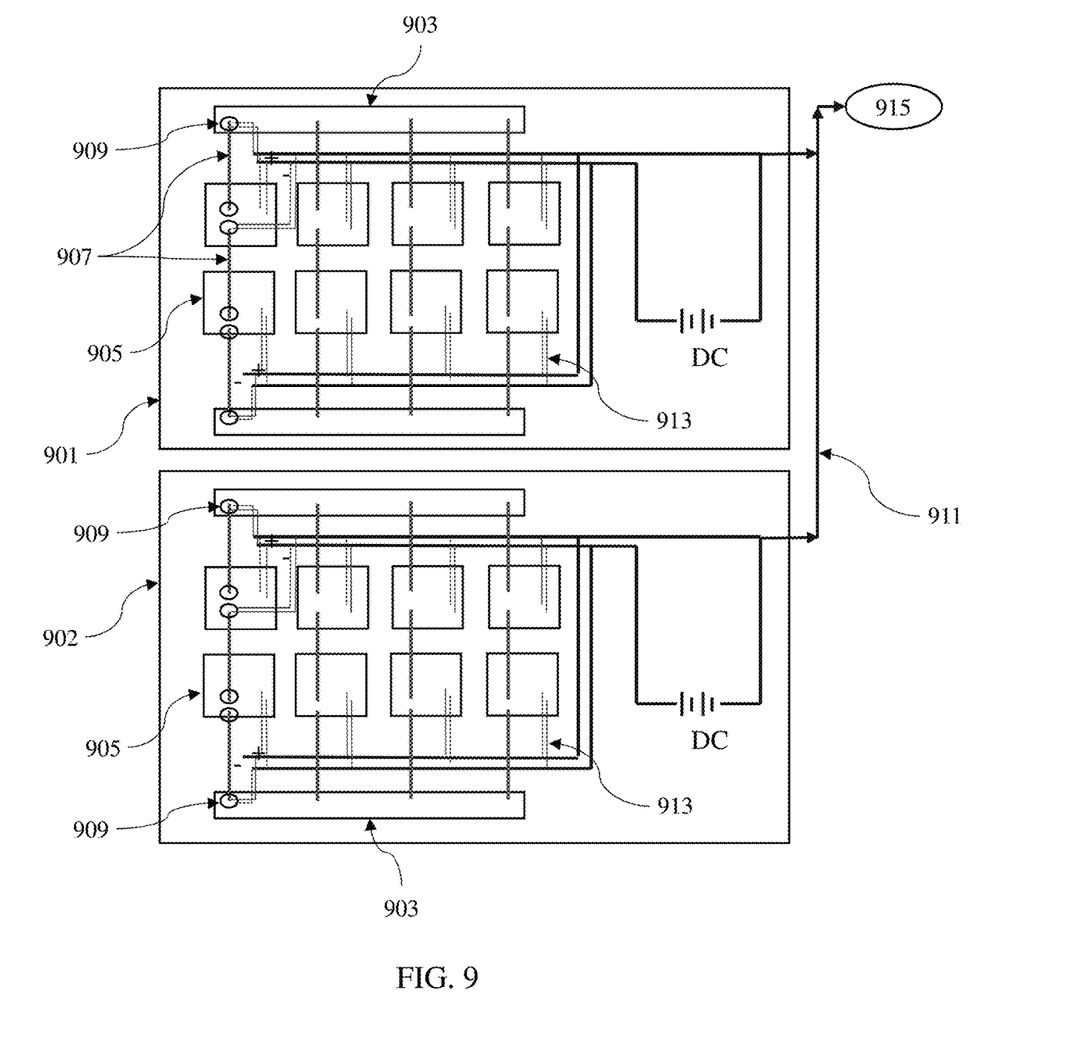
FIG. 9 shows a diagram of a multi-module server cooling system, according to embodiments of the present disclosure.

FIG. 9 shows a diagram of a multi-module server cooling system, according to embodiments of the present disclosure. In this embodiment, two server cooling modules 901, 902 are shown, each with fluid manifolds 903, and cold plates 905 fluidly connected via fluid lines 907. The server cooling system also includes detection lines 913 that can be located at the cold plates 905 and at fluid ports 909 that may be located on either the fluid manifolds 903 or the cold plates 905. The detection lines 913 can be connected with a DC power source and a sensor 915 via electrical connections 911. Although this embodiment only shows two server cooling modules 901, 902, this design can be expanded to include any number of server cooling modules within a data center. By utilizing a single sensor 915 to monitor a number of different server cooling modules, the potential failure rate of the sensors may be decreased, and the overall design of the cooling system is simplified and made more efficient. In some embodiments, the sensor 915 can be integrated with additional controls for further instructions after detecting a leak. Here the accuracy of the detection system from the sensor 915 can be understood as multiple systems, this means this accuracy is lower than the one illustrated in FIG. 8.

Figure 10:
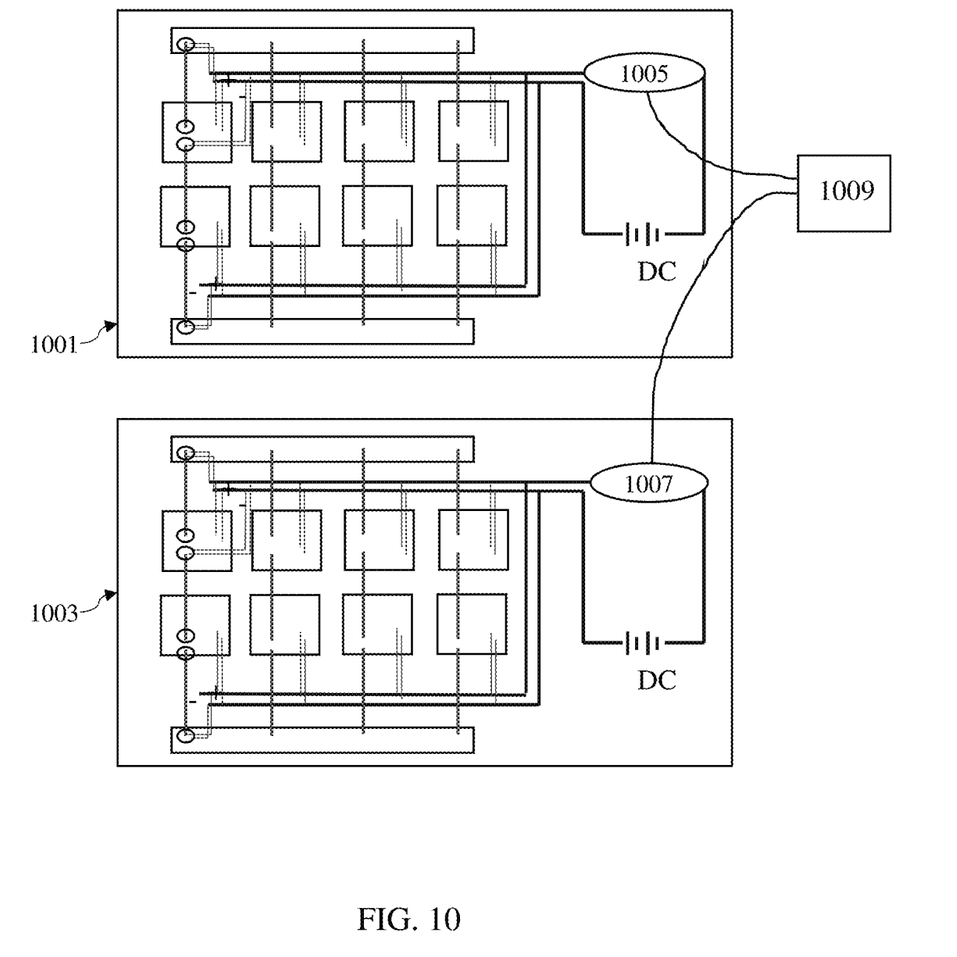
FIG. 10 shows a diagram of another multi-module server cooling system, according to embodiments of the present disclosure.

FIG. 10 shows a diagram of another multi-module server cooling system, according to embodiments of the present disclosure. In this embodiment, two server cooling modules 1001, 1003 include their own dedicated sensor 1005, 1007, which are each connected to a controller 1009. Each server cooling module 1001, 1003 can also include fluid manifolds, cold plates, fluid lines, fluid ports, detection wires, etc. as described above in FIGS. 1A-9, in various embodiments. Connecting server cooling modules 1001, 1003 to a controller 1009 can enable additional features, such as allowing the sensors to provide leakage detection, and also allowing the controller 1009 to identify a corresponding module associated with the leak. In this way, the system can detect leaks early and also identify a location of the leak, thus additionally preventing critical leaks that may damage hardware. The controller 1009 can also generate a message or notification, in some embodiments, that can indicate the existence of, and in some cases the location of, a leak. In some embodiments, a different notification can be generated depending on the number of leaks detected, such that the severity of a leak can be indicated.

Although each sensor 1005, 1007 shown in FIG. 10 is associated with a single server cooling module, one skilled in the art will appreciate that in other embodiments each of these sensors can be associated with a number of cooling modules, as described in reference to FIG. 9. Various other customized arrangements of sensors, controllers, cooling modules, and cooling components are also envisioned by this disclosure and fall within the scope of this disclosure. For example, the arrangement and implementation of the detection wires and/or electrical wires can be different for different objectives or cooling designs. These objectives and cooling designs can vary depending on the types of servers or IT hardware being cooled, in some embodiments.

According to one aspect of the present disclosure, a leak prevention system is disclosed. The system includes a liquid cooling device for a data center including a fluid area configured to receive a cooling fluid. The system also includes at least one pair of detection wires disposed within the liquid cooling device and at least partially surrounding the fluid area of the liquid cooling device. The system also includes a sensor connected to the detection wires and configured to detect when the cooling fluid contacts the detection wires. In one embodiment, the sensor is a current sensor. In one embodiment, the liquid cooling device includes an upper frame and a lower frame, and the detection wires are disposed between the upper frame and the lower frame. In one embodiment, the system also includes an inner sealing pad and an outer sealing pad disposed between the upper frame and the lower frame and surrounding the fluid area of the liquid cooling device. In one such an embodiment, the detection wires are disposed between the inner sealing pad and the outer sealing pad. In another such embodiment, the detection wires are disposed within the inner sealing pad or the outer sealing pad. In one embodiment, the detection wires detect a leak from the fluid area before the leak passes beyond the liquid cooling device.

According to another aspect of the present disclosure, a leak prevention system includes a cooling plate within a liquid cooled data center cooling system. The cooling plate includes a fluid port configured to connect with a fluid hose to receive cooling fluid. The system also includes a pair of detection wires positioned at a junction of the fluid port and the fluid hose, and a sensor connected to the detection wires and configured to detect when the cooling fluid contacts the detection wires. In one embodiment, the sensor is a current sensor. In one embodiment, each fluid port has a number of barbs extending radially outward from an external surface of the fluid port, and the detection wires are positioned between the external surface of the fluid port and the fluid hose across at least one of the barbs. In one embodiment, the sensor and detection wires are configured to detect a leak within the junction of the fluid port and the fluid hose before the cooling fluid leaks beyond the junction. In one embodiment, the system also includes a clamp positioned at the junction of the fluid port and the fluid hose to secure the fluid hose around an external surface of the fluid port. In such an embodiment, the detection wires are positioned between the external surface of the fluid port and the fluid hose and are held in place by the clamp.

According to another aspect of the present disclosure, a leak resistant server cooling module includes a number of cooling plates within a server rack, with each cooling plate configured to receive a cooling fluid within a fluid area. The module also includes a pair of detection wires disposed within each cooling plate and at least partially surrounding the fluid area of each cooling plate. The module also includes an electrical detection bus connecting each pair of detection wires to form a plurality of detection circuits, and one or more sensors in communication with the detection wires via the electrical detection bus and configured to detect when the cooling fluid contacts the detection wires. The module also includes a controller in communication with the sensors and configured to identify a location of a leak when the cooling fluid contacts the detection wires. In one embodiment, each cooling plate includes an upper frame and a lower frame, and the detection wires of each cooling plate are disposed between the upper frame and the lower frame. In one embodiment, the sensors are current sensors. In one embodiment, the module also includes a fluid distribution manifold having one or more fluid ports configured to connect with a fluid hose to receive the cooling fluid. In one embodiment, the module also includes a pair of detection wires positioned at a junction of one of the fluid ports and the fluid hose. In one embodiment, each fluid port has a number of barbs extending radially outward from an external surface of the fluid port, and the detection wires are positioned between the external surface of the fluid port and the fluid hose across at least one of the barbs. In one embodiment, the sensor and detection wires are configured to detect a leak within the junction of the fluid port and the fluid hose before the cooling fluid leaks beyond the junction. In one embodiment, the system also includes a clamp positioned at the junction of one of the fluid ports and the fluid hose to secure the fluid hose around an external surface of the fluid port. In such an embodiment, the detection wires are positioned between the external surface of the fluid port and the fluid hose and held in place by the clamp. In one embodiment, the controller is further configured to generate a notification identifying the location of the leak when the cooling fluid contacts the detection wires.

One skilled in the art would recognize that various adjustments can be made to the system within the scope of this disclosure. The following clauses and/or examples per-

What is claimed is:

1. A leak prevention system, comprising:
   a cold plate adapted to be attached to an electronic component, the cold plate including a fluid area configured to receive a cooling fluid;
   at least one pair of detection wires disposed within the cold plate and at least partially surrounding the fluid area of the cold plate; and
   a sensor connected to the at least one pair of detection wires and configured to detect when the cooling fluid contacts the detection wires.

2. The leak prevention system of claim 1, wherein the sensor is a current sensor.

3. The leak prevention system of claim 1, wherein the cold plate includes an upper frame and a lower frame, and the at least one pair of detection wires is disposed between the upper frame and the lower frame.

4. The leak prevention system of claim 3, further comprising an inner sealing pad and an outer sealing pad disposed between the upper frame and the lower frame and surrounding the fluid area of the cold plate, and wherein the at least one pair of detection wires is disposed between the inner sealing pad and the outer sealing pad.

5. The leak prevention system of claim 3, further comprising an inner sealing pad and an outer sealing pad disposed between the upper frame and the lower frame and surrounding the fluid area of the cold plate, and wherein the at least one pair of detection wires is disposed within the inner sealing pad or the outer sealing pad.

6. The leak prevention system of claim 5, wherein the at least one pair of detection wires detect a leak from the fluid area before the leak passes beyond the cold plate.

7. A leak prevention system, comprising:
   a cooling plate within a liquid cooled data center cooling system, the cooling plate including at least one fluid port configured to connect with a fluid hose to receive a cooling fluid;
   at least one pair of detection wires positioned between an external surface of the at least one fluid port and the fluid hose at a junction of the fluid port and the fluid hose; and
   a sensor connected to the at least one pair of detection wires and configured to detect when the cooling fluid contacts the detection wires.

8. The leak prevention system of claim 7, wherein the sensor is a current sensor.

9. The leak prevention system of claim 7, wherein each fluid port has a plurality of barbs extending radially outward from the external surface of the fluid port, and the at least one pair of detection wires is positioned between the external surface of the fluid port and the fluid hose across at least one of the plurality of barbs.

10. The leak prevention system of claim 7, wherein the sensor and at least one pair of detection wires are configured to detect a leak within the junction of the fluid port and the fluid hose before the cooling fluid leaks beyond the junction.

11. The leak prevention system of claim 7, further comprising a clamp positioned at the junction of the fluid port and the fluid hose and securing the fluid hose around an external surface of the fluid port, and the at least one pair of detection wires is positioned between the external surface of the fluid port and the fluid hose and is held in place by the clamp.

12. A leak resistant server cooling module comprising:
    a plurality of cooling plates within a server rack, each cooling plate configured to be attached to an electronic component and to receive a cooling fluid within a fluid area;
    a pair of detection wires disposed within each cooling plate and at least partially surrounding the fluid area of each cooling plate;
    an electrical detection bus connecting each pair of detection wires to form a plurality of detection circuits;
    one or more sensors in communication with the detection wires via the electrical detection bus and configured to detect when the cooling fluid contacts the detection wires; and
    a controller in communication with the one or more sensors configured to identify a location of a leak when the cooling fluid contacts the detection wires.

13. The leak resistant server cooling module of claim 12, wherein each cooling plate includes an upper frame and a lower frame, and the detection wires of each cooling plate are disposed between the upper frame and the lower frame.

14. The leak resistant server cooling module of claim 12, wherein the one or more sensors are current sensors.

15. The leak resistant server cooling module of claim 12, further comprising a fluid distribution manifold having one or more fluid ports configured to connect with a fluid hose to receive the cooling fluid.

16. The leak resistant server cooling module of claim 15, further comprising at least one pair of detection wires positioned at a junction of one of the fluid ports and the fluid hose.

17. The leak resistant server cooling module of claim 16, wherein each fluid port has a plurality of barbs extending radially outward from an external surface of the fluid port, and the detection wires are positioned between the external surface of the fluid port and the fluid hose across at least one of the plurality of barbs.

18. The leak resistant server cooling module of claim 17, wherein the sensor and detection wires are configured to detect a leak within the junction of the fluid port and the fluid hose before the cooling fluid leaks beyond the junction.

19. The leak resistant server cooling module of claim 16, further comprising a clamp positioned at the junction of one of the fluid ports and the fluid hose, the clamp securing the fluid hose around an external surface of the fluid port, wherein the at least one pair of detection wires is positioned between the external surface of the fluid port and the fluid hose and is held in place by the clamp.

20. The leak resistant server cooling module of claim 12, wherein the controller is further configured to generate a notification identifying the location of the leak when the cooling fluid contacts the detection wires.

* * * * *